United States Patent
Denison et al.

(10) Patent No.: US 9,806,190 B2
(45) Date of Patent: Oct. 31, 2017

(54) HIGH VOLTAGE DRAIN EXTENSION ON THIN BURIED OXIDE SOI

(75) Inventors: Marie Denison, Plano, TX (US); Philip L. Hower, Concord, MA (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/282,305

(22) Filed: Oct. 26, 2011

(65) Prior Publication Data
US 2012/0104497 A1 May 3, 2012

Related U.S. Application Data

(60) Provisional application No. 61/407,804, filed on Oct. 28, 2010.

(51) Int. Cl.
| | |
|---|---|
| H01L 29/78 | (2006.01) |
| H01L 21/336 | (2006.01) |
| H01L 27/12 | (2006.01) |
| H01L 29/10 | (2006.01) |
| H01L 29/861 | (2006.01) |
| H01L 27/06 | (2006.01) |

(52) U.S. Cl.
CPC ...... *H01L 29/7824* (2013.01); *H01L 27/1203* (2013.01); *H01L 29/1087* (2013.01); *H01L 29/7818* (2013.01); *H01L 29/7835* (2013.01); *H01L 29/861* (2013.01); *H01L 27/0629* (2013.01)

(58) Field of Classification Search
CPC .............................. H01L 21/336; H01L 29/78
USPC ....... 257/348, 347, 288, 213, 341, 355, 401, 257/396; 438/155, 467, 200, 237, 253, 438/396
See application file for complete search history.

(56) References Cited

U.S. PATENT DOCUMENTS

| | | | | |
|---|---|---|---|---|
| 4,928,157 A | * | 5/1990 | Matsunaga et al. | 257/362 |
| 5,818,282 A | * | 10/1998 | Sumida | 327/424 |
| 6,121,661 A | * | 9/2000 | Assaderaghi et al. | 257/355 |
| 6,352,882 B1 | | 3/2002 | Assaderaghi et al. | |
| 7,301,204 B2 | * | 11/2007 | Tihanyi | 257/347 |
| 7,718,503 B2 | * | 5/2010 | Pellela et al. | 438/396 |
| 2007/0023827 A1 | * | 2/2007 | Tu et al. | 257/330 |

(Continued)

FOREIGN PATENT DOCUMENTS

| | | | |
|---|---|---|---|
| JP | H04-118924 A | 11/1993 |
| JP | 2003-282878 A | 2/2005 |

(Continued)

*Primary Examiner* — Sheng Zhu
(74) *Attorney, Agent, or Firm* — Jacqueline J. Garner; Charles A. Brill; Frank D. Cimino (57) ABSTRACT

An integrated circuit on an SOI substrate containing an extended drain MOS transistor with a through substrate diode in a drain (n-channel) or body region (p-channel) so that the drain or body region is coupled to the handle wafer through a p-n junction. An integrated circuit on an SOI substrate containing an extended drain MOS transistor with a through substrate diode in a drain (n-channel) or body region (p-channel) coupled to the handle wafer through a p-n junction, that is electrically isolated from the drain or body region. A process of forming an integrated circuit on an SOI substrate containing an extended drain MOS transistor with a through substrate diode in a drain (n-channel) or body region (p-channel).

12 Claims, 8 Drawing Sheets

(56) References Cited

U.S. PATENT DOCUMENTS

| | | | |
|---|---|---|---|
| 2008/0073707 A1* | 3/2008 | Darwish | 257/330 |
| 2008/0224214 A1* | 9/2008 | Lu | 257/347 |
| 2009/0230447 A1 | 9/2009 | Hwang | |
| 2010/0163994 A1 | 7/2010 | Kurz et al. | |
| 2010/0252882 A1* | 10/2010 | Denison et al. | 257/337 |

FOREIGN PATENT DOCUMENTS

| | | |
|---|---|---|
| JP | 2007-150247 A | 12/2008 |
| JP | 2009-60064 A | 9/2010 |

* cited by examiner

HIGH VOLTAGE DRAIN EXTENSION ON THIN BURIED OXIDE SOI

This application claims the benefit of U.S. Provisional Application No. 61/407,804, filed Oct. 28, 2010, the entirety of which is herein incorporated by reference.

FIELD OF THE INVENTION

This invention relates to the field of integrated circuits. More particularly, this invention relates to extended drain MOS transistors in integrated circuits formed on SOI substrates.

BACKGROUND OF THE INVENTION

An integrated circuit may be formed on a silicon on insulator (SOI) substrate, which includes a handle wafer of a semiconductor material such as single crystal silicon, a buried oxide layer located on a top surface of the handle wafer, and an SOI film of semiconductor material such as single crystal silicon located on a top surface of the buried oxide layer. Transistors and possibly other components of the integrated circuit may be formed in the SOI film. The thickness of the buried oxide layer may be limited so as to provide a desired level of performance of short channel metal oxide semiconductor (MOS) transistors in the SOI film. For example, attaining a desired level of off-state leakage current in the short channel MOS transistors may require the buried oxide layer to be no thicker than a certain maximum thickness.

The integrated circuit may include an extended drain MOS transistor with a drift region in the drain region adjacent to the channel region, such as a laterally diffused metal oxide semiconductor (LDMOS) transistor, a double-diffused metal oxide semiconductor (DMOS) transistor or a drain extended metal oxide semiconductor (DEMOS) transistor. It may be desired to operate the extended drain MOS transistor at a higher voltage than the breakdown voltage of the buried oxide layer. Previous attempts to integrate the extended drain MOS transistor have been problematic. One approach has been to increase the thickness of the SOI layer, which may undesirably increase the off-state leakage current in the short channel MOS transistors. Other approaches involve forming an aperture in the buried oxide layer to accommodate a p-n junction proximate to the aperture, which is reverse biased to deplete the handle wafer under the extended drain MOS transistor and thereby reduce the electric field across the buried oxide layer. Patterning the buried oxide layer to form the aperture prior to forming the SOI film may undesirably increase fabrication cost and complexity of the integrated circuit. Similarly, forming a patterned buried oxide layer by selectively ion implanting oxygen may undesirably degrade performance parameters of the integrated circuit as well as undesirably increase fabrication cost and complexity of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an extended drain metal oxide semiconductor (MOS) transistor may be formed on a silicon on insulator (SOI) substrate to include a through substrate diode in the extended drain MOS transistor. The through substrate diode has a through substrate via containing an electrically conductive via fill plug contacting the handle wafer of the SOI substrate. A p-n junction is formed adjacent to a boundary of the through substrate via, so that the handle wafer under the through substrate diode may be depleted by reverse biasing the p-n junction.

In some embodiments, the via fill plug contacts, and makes electrical connection to, the SOI film at the sidewall of the through substrate via. In other embodiments, a dielectric liner may be formed on sidewalls of the through substrate via so that the via fill plug is electrically isolated from drain and body regions of the extended drain MOS transistor. Processes of forming the embodiments are also described.

DETAILED DESCRIPTION OF EXAMPLE EMBODIMENTS

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an extended drain MOS transistor may be formed on an SOI substrate. The extended drain MOS transistor may include a through substrate diode in the extended drain MOS transistor, configured so that a handle wafer of the SOI substrate under the through substrate diode may be depleted by reverse biasing a p-n junction of the through substrate diode. In an n-channel extended drain MOS transistor formed on an SOI substrate with a p-type handle wafer, the through substrate diode may be formed in an n-type drain region of the extended drain MOS transistor. In a p-channel extended drain MOS transistor formed on an SOI substrate with a p-type handle wafer, the through substrate diode may be formed in an n-type body region of the extended drain MOS transistor. The through substrate diode has a through substrate via extending from a top surface of an SOI film of the SOI substrate through a buried oxide layer of the SOI substrate into the handle wafer. An electrically conductive via fill plug is formed in the through substrate via so as to contact the handle wafer. The p-n junction of the through substrate diode is formed adjacent to a boundary of the through substrate via. Elements of the through substrate diode may be formed concurrently with elements of through substrate contacts in the integrated circuit which provide electrical connection to the handle wafer.

FIG. 1A through FIG. 1D are cross-sections of an integrated circuit containing an extended drain MOS transistor, depicting formation of a through substrate diode according to a first embodiment, in successive stages of fabrication. The integrated circuit 1000 is formed in and on an SOI substrate which includes a semiconductor handle wafer 1002 such as a single crystal silicon wafer. The handle wafer has a first conductivity type, assumed to be p-type for the purposes of this description. The SOI substrate also includes a buried oxide layer 1004 formed on a top surface of the handle wafer 1002. The buried oxide layer 1004 is commonly primarily formed of silicon dioxide, but may be any dielectric material such as silicon oxynitride, silicon nitride, or aluminum oxide. The SOI substrate further includes an SOI film 1006 formed on a top surface of the buried oxide layer 1004. The SOI film 1006 has a semiconductor material suitable for forming components of the integrated circuit 1000. A through substrate via 1008 is formed in the SOI substrate, extending from a top surface of the SOI film 1006 through the buried oxide layer 1004, so that a bottom surface of a boundary 1010 of the through substrate via 1008 contacts the handle wafer 1002. The through substrate via 1008 may be formed, for example, by one or more reactive ion etch (RIE) operations through a suitable mask such as photoresist or silicon nitride. In the instant embodiment, the through substrate via 1008 is formed in an n-type region of the extended drain MOS transistor, for example a drain region or a drift region.

Figure 1A:
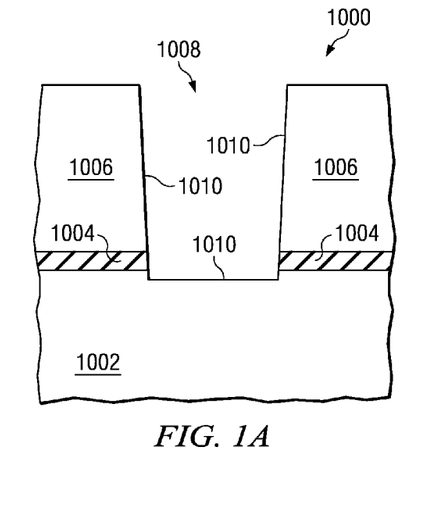
FIG. 1A through FIG. 1D are cross-sections of an integrated circuit containing an extended drain MOS transistor, depicting formation of a through substrate diode according to a first embodiment, in successive stages of fabrication.
Figure 1B:
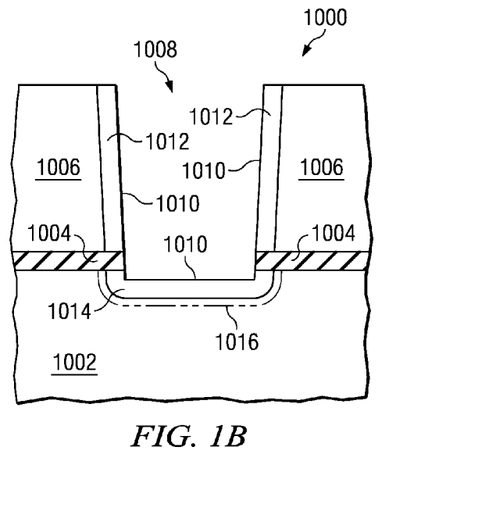

Referring to FIG. 1B, an n-type doped sidewall layer 1012 is formed in the SOI film 1006 at a sidewall of the boundary 1010 of the through substrate via 1008. An n-type doped bottom layer 1014 is formed in the handle wafer 1002 at the bottom surface of the boundary 1010 of the through substrate via 1008. The doped sidewall layer 1012 and the doped bottom layer 1014 are formed concurrently, for example by ion implanting dopants at an angle in several sub doses while rotating the integrated circuit 1000. In one version of the instant embodiment, an average doping density in the doped sidewall layer 1012 and the doped bottom layer 1014 is at least 40 percent more than an average doping density of the SOI film 1006 adjacent to the doped sidewall layer 1012. A p-n junction 1016 is formed in the handle wafer 1002 adjacent to the boundary 1010 of the through substrate via 1008 at the bottom surface.

Figure 1C:
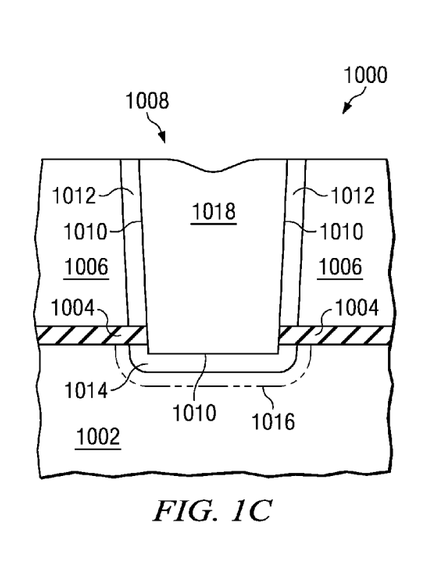

Referring to FIG. 1C, an electrically conductive via fill plug 1018 is formed in the through substrate via 1008 so as to contact the doped bottom layer 1014. The via fill plug 1018 may be, for example, polycrystalline silicon, referred to herein as polysilicon. The via fill plug 1018 may be formed, for example, by depositing a layer of polysilicon in the through substrate via 1008 and over an existing top surface of the integrated circuit 1000 by thermally decomposing SiH4 gas inside a low-pressure reactor at a temperature between 580° C. to 650° C. and subsequently removing polysilicon from the top surface of the integrated circuit 1000 by a chemical mechanical polish (CMP) operation and/or an isotropic plasma etch. The via fill plug 1018 may be undoped or doped to any desired level. In one version of the instant embodiment, the via fill plug 1018 may be doped n-type at an average doping density between 75 percent and 125 percent of an average doping density of the SOI film 1006 adjacent to the doped sidewall layer 1012. The p-n junction 1016 may move during formation of the via fill plug 1018 and/or during subsequent thermal fabrication operations.

Figure 1D:
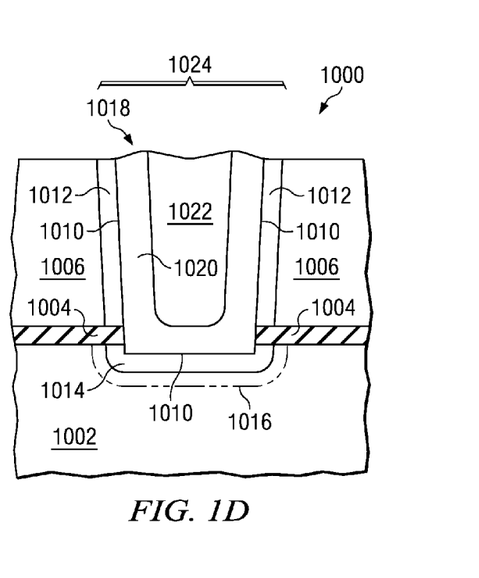

Referring to FIG. 1D, dopants from the doped sidewall layer 1012 and the doped bottom layer 1014 diffuse into the via fill plug 1018 to form a higher conductivity via fill outer region 1020, possibly leaving a lower conductivity via fill core region 1022. A combination of the higher conductivity via fill outer region 1020, the doped bottom layer 1014 and the p-n junction 1016 forms a through substrate diode 1024. During operation of the extended drain MOS transistor, the through substrate diode 1024 may be reverse biased, causing the handle wafer 1002 adjacent to the through substrate diode 1024 to be depleted, reducing an electric field across the buried oxide layer 1004 adjacent to the through substrate diode 1024 as compared to similar extended drain MOS transistors with no through substrate diode operated at a same voltage.

Figure 2A:
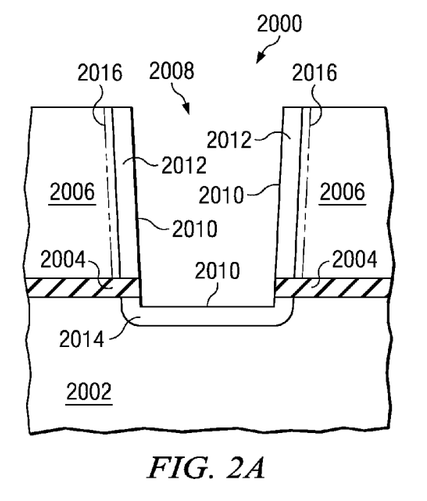
FIG. 2A through FIG. 2C are cross-sections of an integrated circuit containing an extended drain MOS transistor, depicting formation of a through substrate diode according to a second embodiment, in successive stages of fabrication.
Figure 2B:
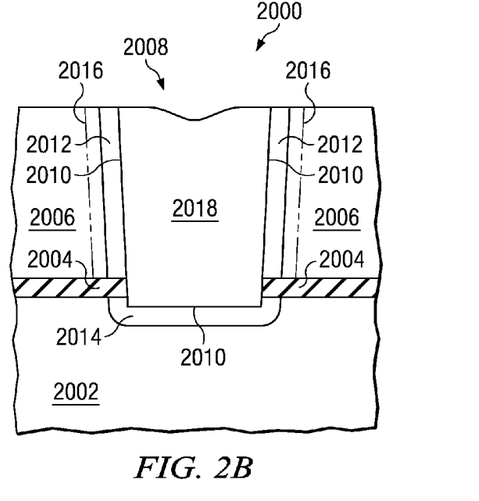
Figure 2C:
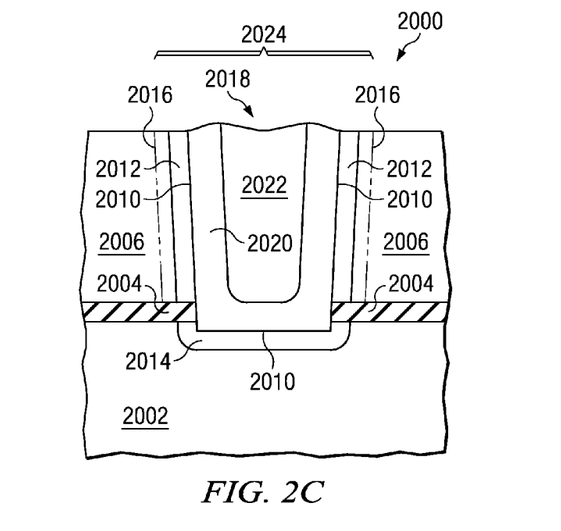

FIG. 2A through FIG. 2C are cross-sections of an integrated circuit containing an extended drain MOS transistor, depicting formation of a through substrate diode according to a second embodiment, in successive stages of fabrication. The integrated circuit 2000 is formed in and on an SOI substrate which includes a semiconductor handle wafer 2002, a buried oxide layer 2004 and an SOI film 2006, as described in reference to FIG. 1A. The handle wafer has a first conductivity type, assumed to be p-type for the purposes of this description. A through substrate via 2008 is formed in the SOI substrate, extending from a top surface of the SOI film 2006 through the buried oxide layer 2004, so that a bottom surface of a boundary 2010 of the through substrate via 2008 contacts the handle wafer 2002. In the instant embodiment, the through substrate via 2008 is formed in an n-type region of the extended drain MOS transistor, for example a drain region or a drift region.

A p-type doped sidewall layer 2012 is formed in the SOI film 2006 at a sidewall of the boundary 2010 of the through substrate via 2008. A p-type doped bottom layer 2014 is formed in the handle wafer 2002 at the bottom surface of the boundary 2010 of the through substrate via 2008. The doped sidewall layer 2012 and the doped bottom layer 2014 are formed concurrently, as described in reference to FIG. 1B. In one version of the instant embodiment, an average doping density in the doped sidewall layer 2012 and the doped bottom layer 2014 is at least 50 percent of an average doping density of the SOI film 2006 adjacent to the doped sidewall layer 2012. A p-n junction 2016 is formed in the SOI film 2006 adjacent to the boundary 2010 of the through substrate via 2008 at the sidewall.

Referring to FIG. 2B, an electrically conductive via fill plug 2018 is formed in the through substrate via 2008 so as to contact the doped bottom layer 2014, as described in reference to FIG. 1C. The via fill plug 2018 may be undoped or doped to any desired level. In one version of the instant embodiment, the via fill plug 2018 may be doped p-type at an average doping density between 75 percent and 125 percent of an average doping density of the SOI film 2006 adjacent to the doped sidewall layer 2012.

Referring to FIG. 2C, dopants from the doped sidewall layer 2012 and the doped bottom layer 2014 diffuse into the via fill plug 2018 to form a higher conductivity via fill outer region 2020, possibly leaving a lower conductivity via fill core region 2022. A combination of the higher conductivity via fill outer region 2020, the doped bottom layer 2014 and the p-n junction 2016 forms a through substrate diode 2024. During operation of the extended drain MOS transistor, the through substrate diode 2024 may be reverse biased, causing the via fill plug 2018 and the handle wafer 2002 adjacent to the through substrate diode 2024 to be depleted, reducing an electric field across the buried oxide layer 2004 adjacent to the through substrate diode 2024 as compared to similar extended drain MOS transistors with no through substrate diode operated at a same voltage.

Figure 3A:
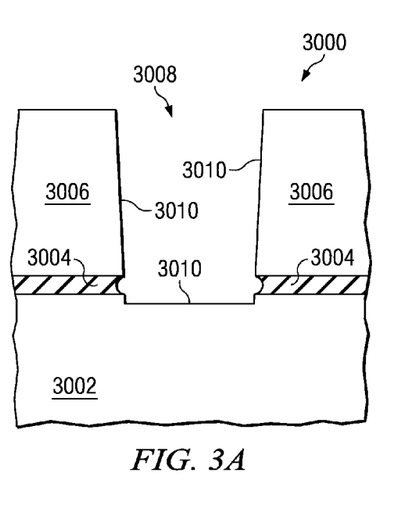
FIG. 3A and FIG. 3B are cross-sections of an integrated circuit containing an extended drain MOS transistor, depicting formation of a through substrate diode according to a third embodiment, in successive stages of fabrication.
Figure 3B:
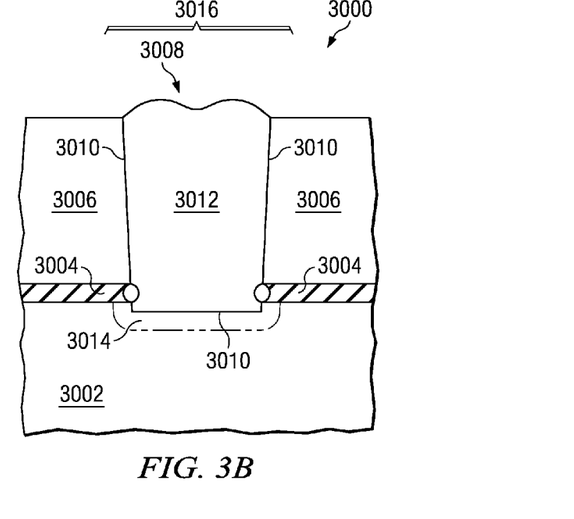

FIG. 3A and FIG. 3B are cross-sections of an integrated circuit containing an extended drain MOS transistor, depicting formation of a through substrate diode according to a third embodiment, in successive stages of fabrication. The integrated circuit 3000 is formed in and on an SOI substrate which includes a semiconductor handle wafer 3002, a buried oxide layer 3004 and an SOI film 3006, as described in reference to FIG. 1A. The handle wafer has a first conductivity type, assumed to be p-type for the purposes of this description. A through substrate via 3008 is formed in the SOI substrate, extending from a top surface of the SOI film 3006 through the buried oxide layer 3004, so that a bottom surface of a boundary 3010 of the through substrate via 3008 contacts the handle wafer 3002. In the instant embodiment, the through substrate via 3008 is formed in an n-type region of the extended drain MOS transistor, for example a drain region or a drift region. A portion of the buried oxide layer 3004 at the boundary 3010 of the through substrate via 3008 may be removed during a cleanup etch prior to a subsequent epitaxial growth process.

Referring to FIG. 3B, an n-type electrically conductive via fill plug 3012 of crystalline silicon is formed in the through substrate via 3008 by an epitaxial growth process. The via fill plug 3012 may completely fill the through substrate via 3008 as depicted in FIG. 3B, or may have a void, not shown, in a center region. A void may be formed between the buried oxide layer 3004 and the via fill plug 3012. In one version of the instant embodiment, the via fill plug 3012 may be doped at an average doping density between 75 percent and 125 percent of an average doping density of the SOI film 3006 adjacent to the through substrate via 3008. A p-n junction 3014 is formed in the handle wafer 3002 adjacent to the boundary 3010 of the through substrate via 3008 at the bottom surface.

A combination of the via fill plug 3012 and the p-n junction 3014 forms a through substrate diode 3016. During operation of the extended drain MOS transistor, the through substrate diode 3016 may be reverse biased, causing the handle wafer 3002 adjacent to the through substrate diode 3016 to be depleted, reducing an electric field across the buried oxide layer 3004 adjacent to the through substrate diode 3016 as compared to similar extended drain MOS transistors with no through substrate diode operated at a same voltage.

Figure 4A:
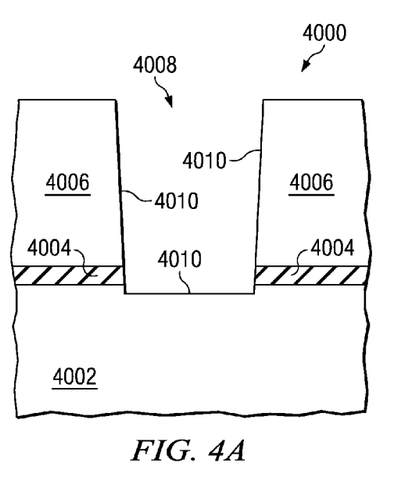
FIG. 4A and FIG. 4B are cross-sections of an integrated circuit containing an extended drain MOS transistor, depicting formation of a through substrate diode according to a fourth embodiment, in successive stages of fabrication.
Figure 4B:
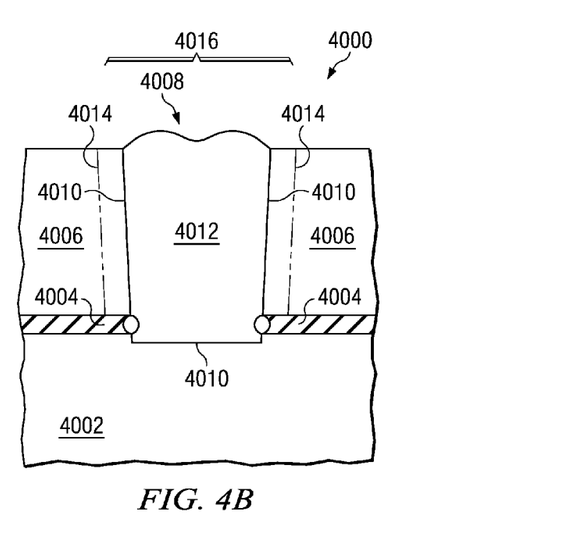

FIG. 4A and FIG. 4B are cross-sections of an integrated circuit containing an extended drain MOS transistor, depicting formation of a through substrate diode according to a fourth embodiment, in successive stages of fabrication. The integrated circuit 4000 is formed in and on an SOI substrate which includes a semiconductor handle wafer 4002, a buried oxide layer 4004 and an SOI film 4006, as described in reference to FIG. 1A. The handle wafer has a first conductivity type, assumed to be p-type for the purposes of this description. A through substrate via 4008 is formed in the SOI substrate, extending from a top surface of the SOI film 4006 through the buried oxide layer 4004, so that a bottom surface of a boundary 4010 of the through substrate via 4008 contacts the handle wafer 4002. In the instant embodiment, the through substrate via 4008 is formed in an n-type region of the extended drain MOS transistor, for example a drain region or a drift region. A portion of the buried oxide layer 4004 at the boundary 4010 of the through substrate via 4008 may be removed during a cleanup etch prior to a subsequent epitaxial growth process.

Referring to FIG. 4B, a p-type electrically conductive via fill plug 4012 of crystalline silicon is formed in the through substrate via 4008 by an epitaxial growth process. The via fill plug 4012 may completely fill the through substrate via 4008 as depicted in FIG. 4B, or may have a void, not shown, in a center region. A void may be formed between the buried oxide layer 4004 and the via fill plug 4012. In one version of the instant embodiment, the via fill plug 4012 may be doped at an average doping density between 75 percent and 125 percent of an average doping density of the SOI film 4006 adjacent to the through substrate via 4008. A p-n junction 4014 is formed in the SOI film 4006 adjacent to the boundary 4010 at a sidewall of the through substrate via 4008.

A combination of the via fill plug 4012 and the p-n junction 4014 forms a through substrate diode 4016. During operation of the extended drain MOS transistor, the through substrate diode 4016 may be reverse biased, causing the via fill plug 4012 and the handle wafer 4002 adjacent to the through substrate diode 4016 to be depleted, reducing an electric field across the buried oxide layer 4004 adjacent to the through substrate diode 4016 as compared to similar extended drain MOS transistors with no through substrate diode operated at a same voltage.

Figure 5A:
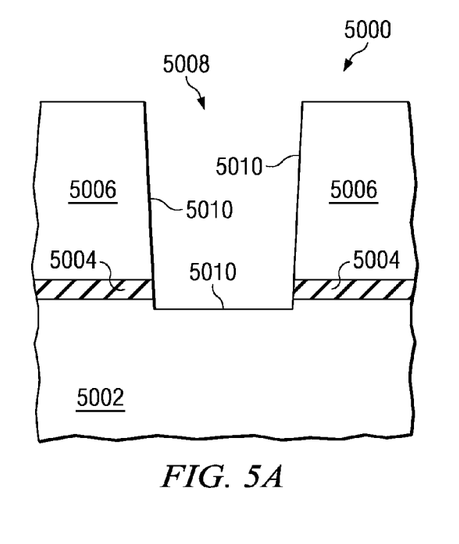
FIG. 5A and FIG. 5B are cross-sections of an integrated circuit containing an extended drain MOS transistor, depicting formation of a through substrate diode according to a fifth embodiment, in successive stages of fabrication.
Figure 5B:
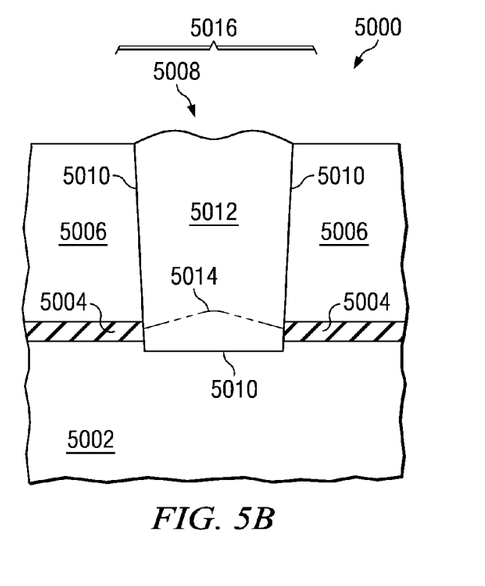

FIG. 5A and FIG. 5B are cross-sections of an integrated circuit containing an extended drain MOS transistor, depicting formation of a through substrate diode according to a fifth embodiment, in successive stages of fabrication. The integrated circuit 5000 is formed in and on an SOI substrate which includes a semiconductor handle wafer 5002, a buried oxide layer 5004 and an SOI film 5006, as described in reference to FIG. 1A. The handle wafer has a first conductivity type, assumed to be p-type for the purposes of this description. A through substrate via 5008 is formed in the SOI substrate, extending from a top surface of the SOI film 5006 through the buried oxide layer 5004, so that a bottom surface of a boundary 5010 of the through substrate via 5008 contacts the handle wafer 5002. In the instant embodiment, the through substrate via 5008 is formed in an n-type region of the extended drain MOS transistor, for example a drain region or a drift region.

Referring to FIG. 5B, an n-type electrically conductive via fill plug 5012 of undoped or lightly doped polysilicon is formed in the through substrate via 5008. The via fill plug 5012 may completely fill the through substrate via 5008 as depicted in FIG. 5B, or may have a void, not shown, in a center region. Dopants from the SOI film 5006 diffuse into a top portion of the polysilicon via fill plug 5012 and dopants from the handle wafer 5002 diffuse into a bottom portion of the polysilicon via fill plug 5012 to form p-n junction 5014 in the via fill plug 5012 adjacent to the boundary 5010 of the through substrate via 5008 at the bottom surface.

A combination of the via fill plug 5012 and the p-n junction 5014 forms a through substrate diode 5016. During operation of the extended drain MOS transistor, the through substrate diode 5016 may be reverse biased, causing the handle wafer 5002 adjacent to the through substrate diode 5016 to be depleted, reducing an electric field across the buried oxide layer 5004 adjacent to the through substrate diode 5016 as compared to similar extended drain MOS transistors with no through substrate diode operated at a same voltage.

Figure 6A:
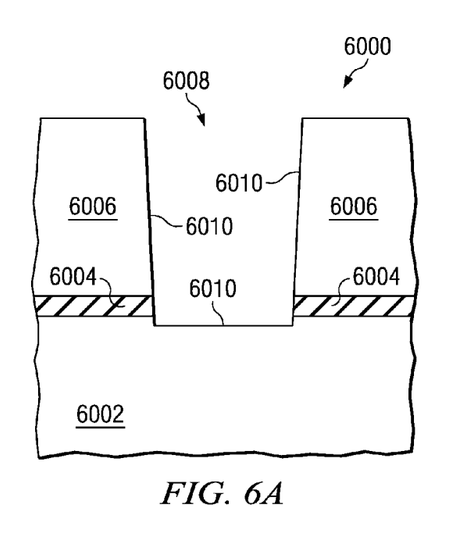
FIG. 6A and FIG. 6B are cross-sections of an integrated circuit containing an extended drain MOS transistor, depicting formation of a through substrate diode according to a sixth embodiment, in successive stages of fabrication.
Figure 6B:
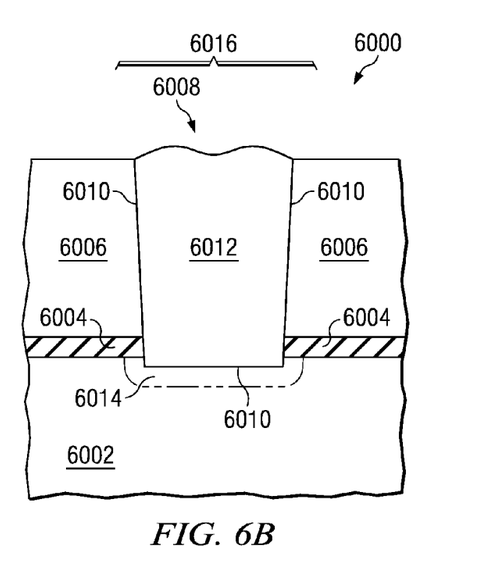

FIG. 6A and FIG. 6B are cross-sections of an integrated circuit containing an extended drain MOS transistor, depicting formation of a through substrate diode according to a sixth embodiment, in successive stages of fabrication. The integrated circuit 6000 is formed in and on an SOI substrate which includes a semiconductor handle wafer 6002, a buried oxide layer 6004 and an SOI film 6006, as described in reference to FIG. 1A. The handle wafer has a first conductivity type, assumed to be p-type for the purposes of this description. A through substrate via 6008 is formed in the SOI substrate, extending from a top surface of the SOI film 6006 through the buried oxide layer 6004, so that a bottom surface of a boundary 6010 of the through substrate via 6008 contacts the handle wafer 6002. In the instant embodiment, the through substrate via 6008 is formed in an n-type region of the extended drain MOS transistor, for example a drain region or a drift region.

Referring to FIG. 6B, an n-type electrically conductive via fill plug 6012 of n-type polysilicon is formed in the through substrate via 6008. The via fill plug 6012 may completely fill the through substrate via 6008 as depicted in FIG. 6B, or may have a void, not shown, in a center region. In one version of the instant embodiment, the via fill plug 6012 may be doped at an average doping density between 75 percent and 125 percent of an average doping density of the SOI film 6006 adjacent to the through substrate via 6008. A p-n junction 6014 is formed in the handle wafer 6002 adjacent to the boundary 6010 of the through substrate via 6008 at the bottom surface.

A combination of the via fill plug 6012 and the p-n junction 6014 forms a through substrate diode 6016. During operation of the extended drain MOS transistor, the through substrate diode 6016 may be reverse biased, causing the handle wafer 6002 adjacent to the through substrate diode 6016 to be depleted, reducing an electric field across the buried oxide layer 6004 adjacent to the through substrate diode 6016 as compared to similar extended drain MOS transistors with no through substrate diode operated at a same voltage.

Figure 7A:
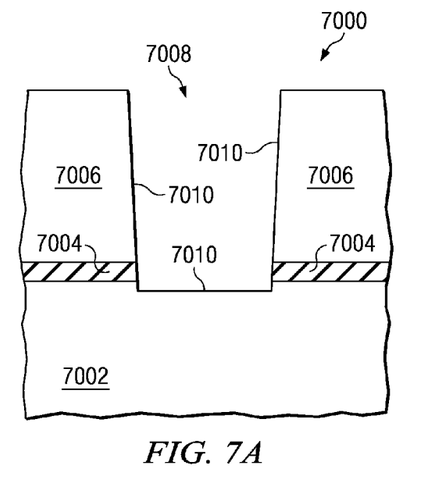
FIG. 7A and FIG. 7B are cross-sections of an integrated circuit containing an extended drain MOS transistor, depicting formation of a through substrate diode according to a seventh embodiment, in successive stages of fabrication.
Figure 7B:
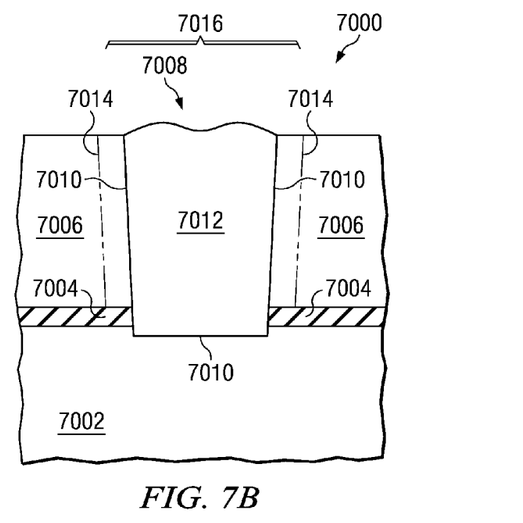

FIG. 7A and FIG. 7B are cross-sections of an integrated circuit containing an extended drain MOS transistor, depicting formation of a through substrate diode according to a seventh embodiment, in successive stages of fabrication. The integrated circuit 7000 is formed in and on an SOI substrate which includes a semiconductor handle wafer 7002, a buried oxide layer 7004 and an SOI film 7006, as described in reference to FIG. 1A. The handle wafer has a first conductivity type, assumed to be p-type for the purposes of this description. A through substrate via 7008 is formed in the SOI substrate, extending from a top surface of the SOI film 7006 through the buried oxide layer 7004, so that a bottom surface of a boundary 7010 of the through substrate via 7008 contacts the handle wafer 7002. In the instant embodiment, the through substrate via 7008 is formed in an n-type region of the extended drain MOS transistor, for example a drain region or a drift region.

Referring to FIG. 7B, a p-type electrically conductive via fill plug 7012 of p-type polysilicon is formed in the through substrate via 7008. The via fill plug 7012 may completely fill the through substrate via 7008 as depicted in FIG. 7B, or may have a void, not shown, in a center region. In one version of the instant embodiment, the via fill plug 7012 may be doped at an average doping density between 75 percent and 125 percent of an average doping density of the SOI film 7006 adjacent to the through substrate via 7008. A p-n junction 7014 is formed in the SOI film 7006 adjacent to the boundary 7010 at a sidewall of the through substrate via 7008.

A combination of the via fill plug 7012 and the p-n junction 7014 forms a through substrate diode 7016. During operation of the extended drain MOS transistor, the through substrate diode 7016 may be reverse biased, causing the via fill plug 7012 and the handle wafer 7002 adjacent to the through substrate diode 7016 to be depleted, reducing an electric field across the buried oxide layer 7004 adjacent to the through substrate diode 7016 as compared to similar extended drain MOS transistors with no through substrate diode operated at a same voltage.

Figure 8A:
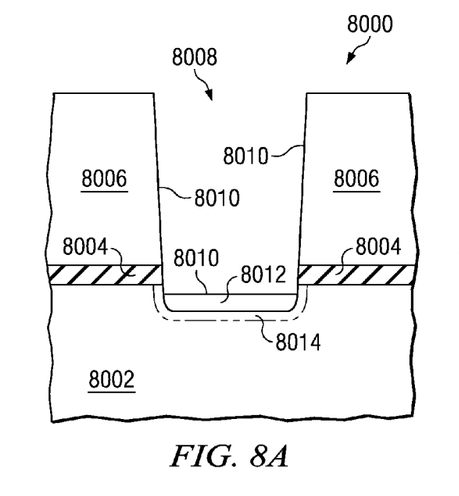
FIG. 8A and FIG. 8B are cross-sections of an integrated circuit containing an extended drain MOS transistor, depicting formation of a through substrate diode according to an eighth embodiment, in successive stages of fabrication.
Figure 8B:
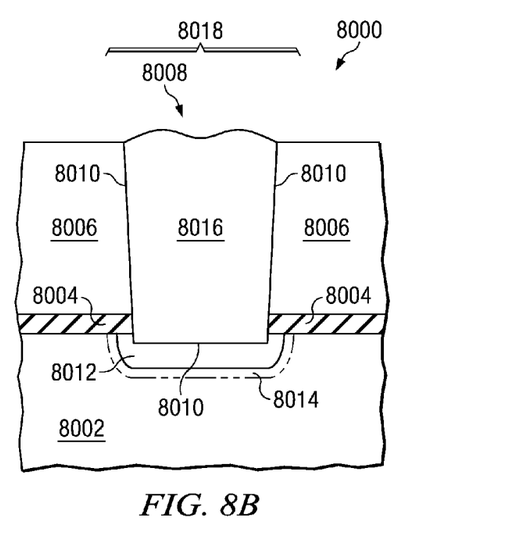

FIG. 8A and FIG. 8B are cross-sections of an integrated circuit containing an extended drain MOS transistor, depicting formation of a through substrate diode according to an eighth embodiment, in successive stages of fabrication. The integrated circuit 8000 is formed in and on an SOI substrate which includes a semiconductor handle wafer 8002, a buried oxide layer 8004 and an SOI film 8006, as described in reference to FIG. 1A. The handle wafer has a first conductivity type, assumed to be p-type for the purposes of this description. A through substrate via 8008 is formed in the SOI substrate, extending from a top surface of the SOI film 8006 through the buried oxide layer 8004, so that a bottom surface of a boundary 8010 of the through substrate via 8008 contacts the handle wafer 8002. In the instant embodiment, the through substrate via 8008 is formed in an n-type region of the extended drain MOS transistor, for example a drain region or a drift region.

An ion implant operation is performed on the integrated circuit 8000 which forms an n-type implanted layer 8012 in the handle wafer 8002 at the bottom surface of a boundary 8010 of the through substrate via 8008. Forming the n-type implanted layer 8012 in the handle wafer 8002 results in a p-n junction 8014 in the handle wafer 8002 adjacent to the boundary 8010 of the through substrate via 8008 at the bottom surface. Dopants in the implanted layer 8012 may be activated during subsequent thermal operations, such as anneal operations.

Referring to FIG. 8B, an electrically conductive via fill plug 8016 is formed in the through substrate via 8008. The via fill plug 8016 may be formed, for example, of undoped or n-type polysilicon or epitaxial silicon. Dopants from the SOI film 8006 and the implanted layer 8012 may diffuse into the via fill plug 8016 to provide increased electrical conductivity between the SOI film 8006 and the implanted layer 8012. The via fill plug 8016 may completely fill the through substrate via 8008 as depicted in FIG. 8B, or may have a void, not shown, in a center region. The p-n junction 8014 may move during formation of the via fill plug 8016 and/or during subsequent thermal fabrication operations.

A combination of the via fill plug 8016 and the p-n junction 8014 forms a through substrate diode 8018. During operation of the extended drain MOS transistor, the through substrate diode 8018 may be reverse biased, causing the handle wafer 8002 adjacent to the through substrate diode 8018 to be depleted, reducing an electric field across the buried oxide layer 8004 adjacent to the through substrate diode 8018 as compared to similar extended drain MOS transistors with no through substrate diode operated at a same voltage.

FIG. 9A through FIG. 9D are cross-sections of an integrated circuit containing an extended drain MOS transistor, depicting formation of a through substrate diode according to a ninth embodiment, in successive stages of fabrication. The integrated circuit 9000 is formed in and on an SOI substrate which includes a semiconductor handle wafer 9002, a buried oxide layer 9004 and an SOI film 9006, as described in reference to FIG. 1A. The handle wafer has a first conductivity type, assumed to be p-type for the purposes of this description. A through substrate via 9008 is formed in the SOI substrate, extending from a top surface of the SOI film 9006 through the buried oxide layer 9004, so that a bottom surface of a boundary 9010 of the through substrate via 9008 contacts the handle wafer 9002. In the instant embodiment, the through substrate via 9008 is formed in an n-type region of the extended drain MOS transistor, for example a drain region or a drift region.

Figure 9A:
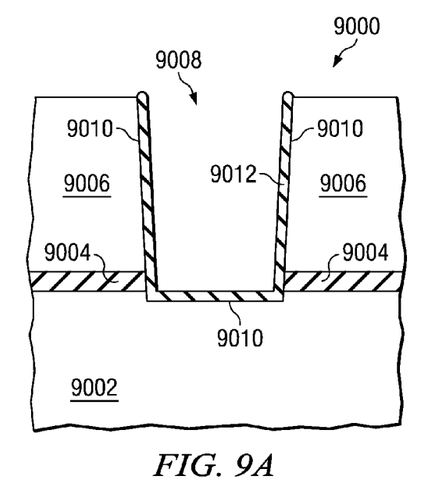
FIG. 9A through FIG. 9D are cross-sections of an integrated circuit containing an extended drain MOS transistor, depicting formation of a through substrate diode according to an ninth embodiment, in successive stages of fabrication.

A dielectric liner 9012 is formed at a sidewall, and possibly at a bottom surface, of the boundary 9010 of the through substrate via 9008. The dielectric liner 9012 may include one or more layers of, for example, silicon dioxide, silicon oxynitride, silicon nitride or other dielectric material. In one version of the instant embodiment, the dielectric liner 9012 may be formed by thermal oxidation of exposed semiconductor material at the boundary 9010 of the through substrate via 9008. In another version, the dielectric liner 9012 may be formed by deposition of dielectric material by chemical vapor deposition (CVD), plasma enhanced chemical vapor deposition (PECVD), low pressure chemical vapor deposition (LPCVD), atmospheric pressure chemical vapor deposition (APCVD), or other suitable dielectric layer formation process.

Figure 9B:
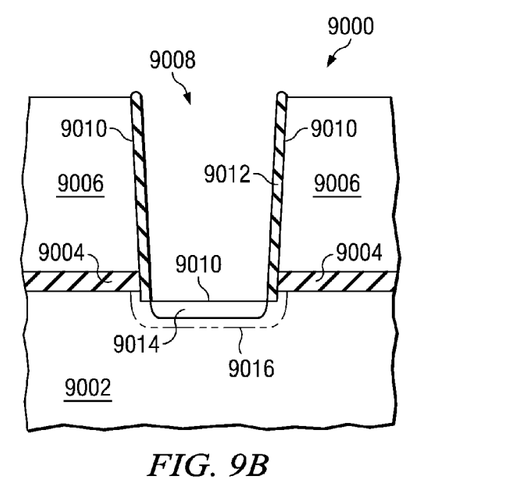

Referring to FIG. 9B, material is removed from the dielectric liner 9012, for example by an RIE process, so as to expose the handle wafer 9002 at the bottom surface of the boundary 9010. Sufficient dielectric liner 9012 remains on the sidewall of the boundary 9010 to electrically isolate the SOI film 9006 from a subsequently formed via plug.

An ion implant operation is performed on the integrated circuit 9000 which forms an n-type implanted layer 9014 in the handle wafer 9002 at the bottom surface of the boundary 9010. Forming the n-type implanted layer 9014 in the handle wafer 9002 results in a p-n junction 9016 in the handle wafer 9002 adjacent to the boundary 9010 of the through substrate via 9008 at the bottom surface. Dopants in the implanted layer 9014 may be activated during subsequent thermal operations, such as anneal operations.

Figure 9C:
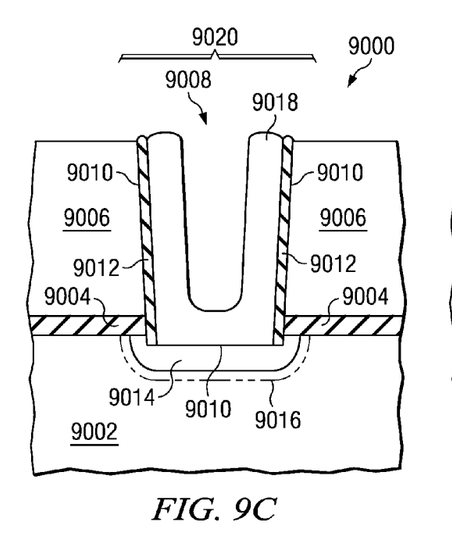
Figure 9D:
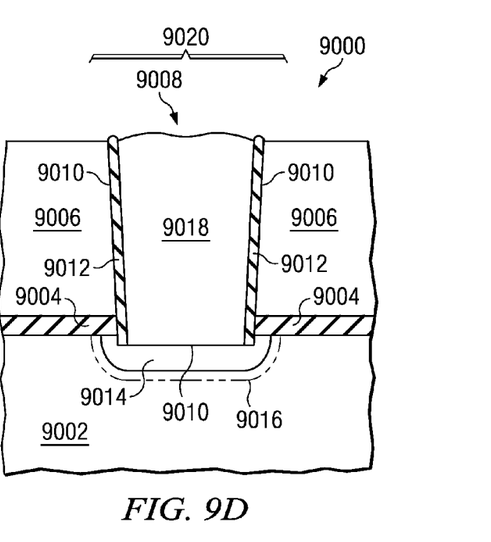

Referring to FIG. 9C, an electrically conductive via fill plug 9018 is formed in the through substrate via 9008 so as to make electrical contact with the implanted layer 9014. The via fill plug 9018 may be formed, for example, of polysilicon or a metal such as tungsten. The via fill plug 9018 is electrically isolated from the SOI film 9006 by the dielectric liner 9012. In one version of the instant embodiment, the via fill plug 9018 may have a void in a center region, as depicted in FIG. 9C. In another version, the via fill plug 9018 may completely fill the through substrate via 9008 as depicted in FIG. 9D. The p-n junction 9016 may move during formation of the via fill plug 9018 and/or during subsequent thermal fabrication operations.

A combination of the via fill plug 9018, the dielectric liner 9012 and the p-n junction 9016 forms a through substrate diode 9020. During operation of the extended drain MOS transistor, the through substrate diode 9020 may be reverse biased, causing the handle wafer 9002 adjacent to the through substrate diode 9020 to be depleted, reducing an electric field across the buried oxide layer 9004 adjacent to the through substrate diode 9020 as compared to similar extended drain MOS transistors with no through substrate diode operated at a same voltage. Forming the via fill plug 9018 to be electrically isolated from the SOI film 9006 may allow the through substrate diode 9020 to be biased at a different voltage than the SOI film 9006 adjacent to the through substrate diode 9020. Voltage on the through substrate diode 9020 may be adjusted to further reduce the electric field across the buried oxide layer 9004 adjacent to the through substrate diode 9020.

Figure 10:
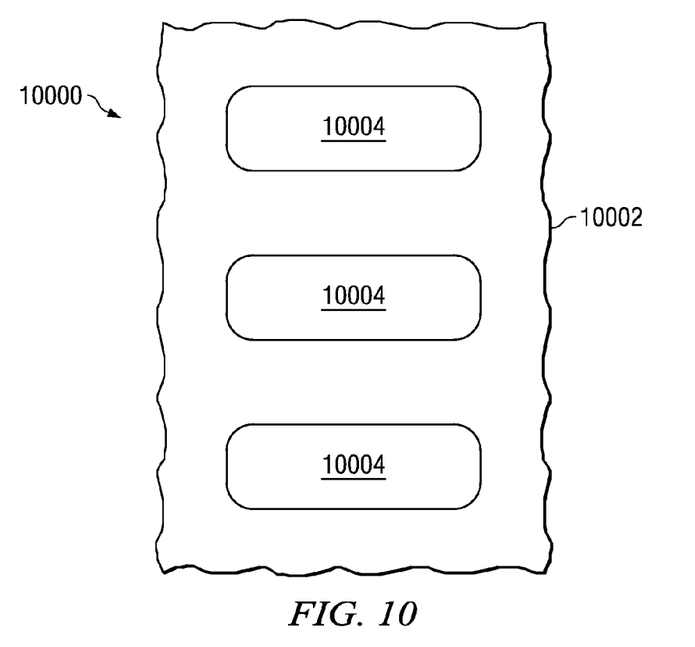
FIG. 10 and FIG. 11 are top views of integrated circuits containing extended drain MOS transistors with through substrate diodes formed according to embodiments.
Figure 11:
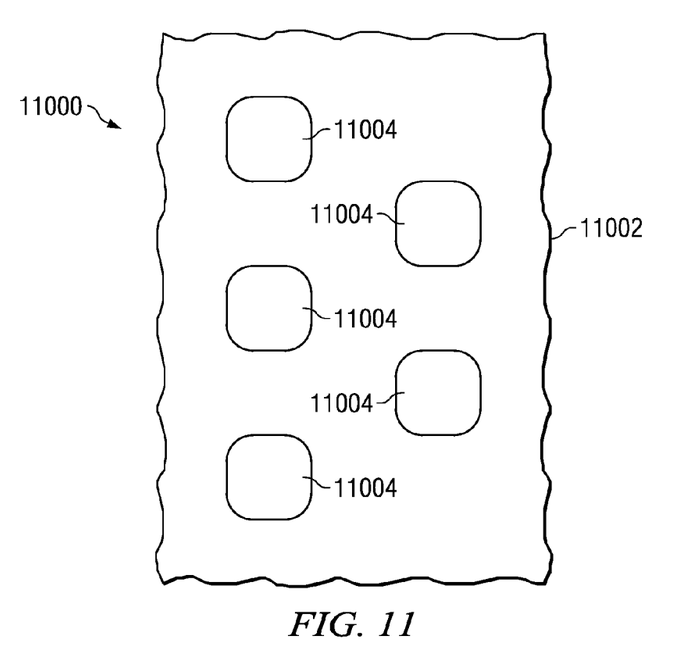

FIG. 10 and FIG. 11 are top views of integrated circuits containing extended drain MOS transistors with through substrate diodes formed according to embodiments. Referring to FIG. 10, an integrated circuit 10000 contains an n-type region 10002. In a version of the instant embodiment in which the extended drain MOS transistor is n-channel, the n-type region 10002 may be a drain region of the extended drain MOS transistor. In a version of the instant embodiment in which the extended drain MOS transistor is p-channel, the n-type region 10002 may be a body region of the extended drain MOS transistor. One or more elongated through substrate diodes 10004 are formed in the n-type region 10002, for example according to one of the embodiments described supra. Elongated through substrate diodes 10004 have length:width ratios greater than 2:1. Referring to FIG. 11, an integrated circuit 11000 contains an n-type region 11002. One or more substantially equilateral through substrate diodes 11004 are formed in the n-type region 11002, for example according to one of the embodiments described supra. Substantially equilateral through substrate diodes 11004 have length:width ratios less than 1.25:1. It will be recognized that through substrate diodes with other length:width ratios and/or other shapes, such as circles, ovals, ells or crosses may be formed according to the embodiments supra.

Figure 12:
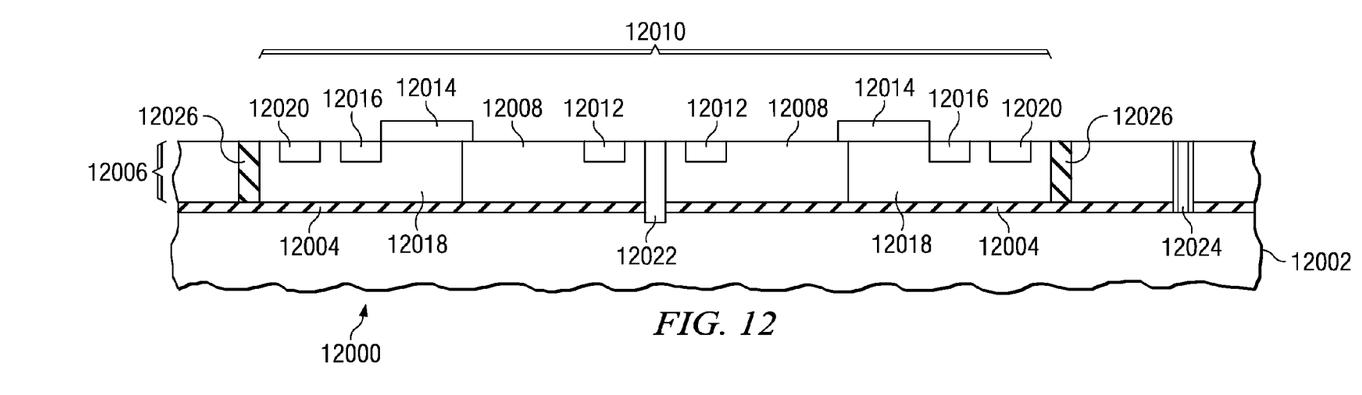
FIG. 12 and FIG. 13 are cross-sections of integrated circuits containing extended drain MOS transistors with through substrate diodes according to embodiments.
Figure 13:
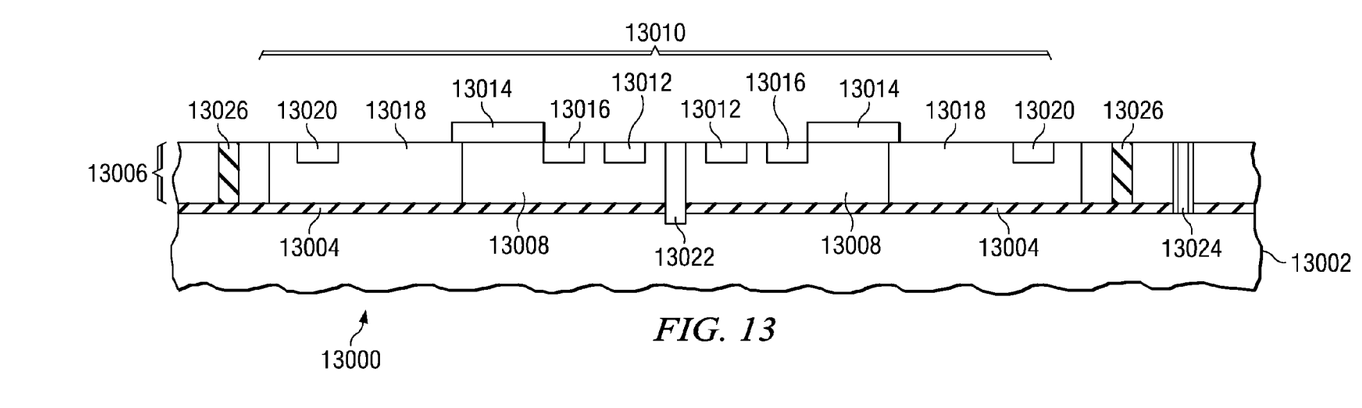

FIG. 12 and FIG. 13 are cross-sections of integrated circuits containing extended drain MOS transistors with through substrate diodes according to embodiments. Referring to FIG. 12, an integrated circuit 12000 is formed in and on an SOI substrate which includes a semiconductor handle wafer 12002, a buried oxide layer 12004 and an SOI film 12006, as described in reference to FIG. 1A. The handle wafer has a first conductivity type, assumed to be p-type for the purposes of this description. An n-type drain region 12008 is formed in the SOI film 12006 in a symmetric n-channel extended drain MOS transistor 12010, flanked by p-type body regions 12018. N-type drain contact diffused regions 12012 are formed in the drain region 12008. MOS gates 12014 are formed on gate dielectric layers, not shown, on the SOI film 12006 over channel regions in the body regions 12018 of the extended drain MOS transistor 12010 adjacent to the drain region 12008. N-type source regions 12016 are formed in the SOI film 12006 in the body regions 12018 adjacent to the MOS gates 12014 and opposite the drain region 12008. P-type body contact diffused regions 12020 are formed in the body regions 12018.

One or more through substrate diodes 12022 are formed in the drain region 12008, for example according to one of the embodiments described supra, to make electrical contact to the handle wafer 12002 through a p-n junction. One or more through substrate contacts 12024 may be formed in the SOI film 12006 outside the MOS transistor 12010 through the buried oxide layer 12004 so as to make electrical contact to the handle wafer 12002. The through substrate contacts 12024 are formed in contact vias which extend through the SOI film 12006 and through the buried oxide layer 12004. The through substrate contacts 12024 include electrically conductive material depicted in dark shading in FIG. 12 contacting the handle wafer 12002. One or more deep isolation trenches 12026 may be formed in the SOI film 12006 outside the MOS transistor 12010 and possibly through the buried oxide layer 12004, so as to electrically isolate portions of the SOI film 12004 on either side of the deep isolation trenches 12026. The deep isolation trenches 12026 are formed in isolation trenches which are filled with dielectric material such as silicon dioxide to provide electrical isolation. Through substrate vias for the through substrate diodes 12022, contact vias for the through substrate contacts 12024 and/or isolation trenches for the deep isolation trenches 12026 may be formed concurrently, which may advantageously reduce a fabrication cost of the integrated circuit 12000. Via fill plugs for the through substrate diodes 12022 and electrically conductive material for the through substrate contacts 12024 may be formed concurrently.

Referring to FIG. 13, an integrated circuit 13000 is formed in and on an SOI substrate which includes a semiconductor handle wafer 13002, a buried oxide layer 13004 and an SOI film 13006, as described in reference to FIG. 1A. The handle wafer has a first conductivity type, assumed to be p-type for the purposes of this description. An n-type body region 13008 is formed in the SOI film 13006 in a symmetric p-channel extended drain MOS transistor 13010, flanked by p-type drain regions 13018. N-type body contact diffused regions 13012 are formed in the body region 13008. MOS gates 13014 are formed on gate dielectric layers, not shown, on the SOI film 13006 over channel regions in the body regions 13018 of the extended drain MOS transistor 13010 adjacent to the drain regions 13018. P-type source regions 13016 are formed in the SOI film 13006 in n-type body region 13008 adjacent to the MOS gates 13014 and opposite the drain regions 13018. P-type drain contact diffused regions 13020 are formed in the drain regions 13018.

One or more through substrate diodes 13022 are formed in the body region 13008, for example according to one of the embodiments described supra, to make electrical contact to the handle wafer 13002 through a p-n junction. One or more through substrate contacts 13024 is formed in the SOI film 13006 outside the MOS transistor 13010 through the buried oxide layer 13004 so as to make electrical contact to the handle wafer 13002. One or more deep isolation trenches 13026 may be formed in the SOI film 13006 outside the MOS transistor 13010 and possibly through the buried oxide layer 13004, so as to electrically isolate portions of the SOI film 13004 on either side of the deep isolation trenches 13026. Through substrate vias for the through substrate diodes 13022, contact vias for the through substrate contacts 13024, and/or isolation trenches for the deep isolation trenches 13026 may be formed concurrently. Via fill plugs for the through substrate diodes 13022 and electrically conductive material for the through substrate contacts 13024 may be formed concurrently.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. An integrated circuit, comprising:
a silicon on insulator (SOI) substrate, including:
a handle wafer, of semiconductor material having a first conductivity type;
a buried oxide layer, of dielectric material, located on a top surface of said handle wafer; and
an SOI film of semiconductor material, located on a top surface of said buried oxide layer; and
an extended drain metal oxide semiconductor (MOS) transistor, including:
a region located in said SOI film, said region extending from a top surface of the SOI film to said buried oxide layer and having an opposite conductivity type from said handle wafer; and
a through substrate diode extending through said region, including:
a through substrate via extending from a top surface of said SOI film through said buried oxide layer into said handle wafer;
an electrically conductive via fill plug in said through substrate via, said via fill plug making electrical contact to said SOI film adjacent to said through substrate vias and to said handle wafer, wherein said via fill plug includes polysilicon of said first conductivity type; and
a p-n junction adjacent to a boundary of said through substrate via, said p-n junction including a first p-n region in said SOI film extending from a top-surface of said SOI film to said buried oxide layer on at least two opposite sides of the through substrate via.
2. The integrated circuit of claim 1, in which:
said handle wafer is p-type;
said extended drain MOS transistor is n-channel; and said region is an n-type drain region.

3. The integrated circuit of claim 1, in which said first p-n junction region includes a doped sidewall layer of said first conductivity type adjacent said through substrate via.

4. The integrated circuit of claim 1, in which
said handle wafer is p-type;
said extended drain MOS transistor is p-channel;
and said region is an n-type body region.

5. The integrated circuit of claim 1, further including a through substrate contact located outside said extended drain MOS transistor.

6. The integrated circuit of claim 1, wherein said region is an n-type extended drain region, wherein the n-type extended drain region extends on both sides of the through substrate diode.

7. A process of forming an integrated circuit, comprising steps:
providing an SOI substrate, said SOI substrate including:
a handle wafer, of semiconductor material having a first conductivity type;
a buried oxide layer, of dielectric material, formed on a top surface of said handle wafer; and
an SOI film of semiconductor material, formed on a top surface of said buried oxide layer; and
forming an extended drain metal oxide semiconductor (MOS) transistor, by a process including steps:
forming a region located in said SOI film, so that said region extends from a top surface of the SOI film to the buried layer and has an opposite conductivity type from said handle wafer; and
forming a through substrate diode in said region, by a process including steps:
forming a through substrate via extending from a top surface of said SOI film through said region and said buried oxide layer into said handle wafer;
forming an electrically conductive via fill plug in said through substrate via, said via fill plug making electrical contact to said handle wafer, wherein said via fill plug includes polysilicon of said first conductivity type; and
forming a p-n junction adjacent to a boundary of said through substrate via, said p-n junction including a first p-n junction region in said SOI film extending from a top-surface of said SOI film to said buried oxide layer on at least two opposite sides of the through substrate via.

8. The process of claim 7, in which:
said handle wafer is p-type;
said extended drain MOS transistor is n-channel;
said region is an n-type drain region.

9. The process of claim 7, in which said first p-n junction region includes a doped sidewall layer of said first conductivity type adjacent to said through substrate via.

10. The process of claim 7, in which:
said handle wafer is p-type;
said extended drain MOS transistor is p-channel;
and said region is an n-type body region.

11. The process of claim 7, further including the step of forming a through substrate contact outside said extended drain MOS transistor by a process including a step of forming a contact via through said SOI film and through said buried oxide layer, said contact via being formed concurrently with said through substrate via.

12. The process of claim 7, further including the step of forming a deep isolation trench outside said extended drain MOS transistor by a process including a step of forming an isolation trench in said SOI film, said isolation trench being formed concurrently with said through substrate via.

* * * * *